(12) United States Patent
Curt et al.

(10) Patent No.: US 8,125,345 B2
(45) Date of Patent: Feb. 28, 2012

(54) METHOD AND APPARATUS FOR LOOSE WIRING MONITOR

(75) Inventors: Walter Curt, Harrisonburg, VA (US); Christopher Mullins, Penn Laird, VA (US)

(73) Assignee: Power Monitors, Mount Crawford, VA (US)

( * ) Notice: Subject to any disclaimer, the term of this patent is extended or adjusted under 35 U.S.C. 154(b) by 460 days.

(21) Appl. No.: 12/040,711

(22) Filed: Feb. 29, 2008

(65) Prior Publication Data
US 2008/0211683 A1    Sep. 4, 2008

Related U.S. Application Data

(60) Provisional application No. 60/892,462, filed on Mar. 1, 2007.

(51) Int. Cl.
*G08B 21/00* (2006.01)
(52) U.S. Cl. .................. 340/652; 340/687; 361/88
(58) Field of Classification Search .......... 340/635–664, 340/687; 361/88–92
See application file for complete search history.

(56) References Cited

U.S. PATENT DOCUMENTS

| | | | | |
|---|---|---|---|---|
| 4,067,054 A * | 1/1978 | Clark | ............... | 361/91.5 |
| 4,558,275 A * | 12/1985 | Borowy et al. | ............ | 324/103 P |
| 5,659,453 A * | 8/1997 | Russell et al. | ............... | 361/93.1 |
| 5,831,538 A * | 11/1998 | Schena | ............... | 340/635 |
| 6,734,682 B2 * | 5/2004 | Tallman et al. | ............... | 324/528 |
| 7,462,952 B2 * | 12/2008 | Bailey | ............... | 307/9.1 |
| 2002/0063635 A1 | 5/2002 | Shincovich | | |
| 2003/0197989 A1 * | 10/2003 | Nojima | ............... | 361/47 |
| 2005/0212526 A1 | 9/2005 | Blades | | |
| 2006/0061480 A1 | 3/2006 | Bowman | | |
| 2006/0087322 A1 | 4/2006 | McCollough | | |
| 2006/0098371 A1 * | 5/2006 | Wambsganss et al. | ....... | 361/103 |

* cited by examiner

*Primary Examiner* — Jeffery Hofsass
(74) *Attorney, Agent, or Firm* — K&L Gates LLP

(57) ABSTRACT

A system is provided in which the voltage phases, neutral, and ground are monitored and an alarm is generated if specific trigger conditions are met. These conditions are indicative of a possible loose neutral, loose wiring, or general over/under voltage condition. Specific algorithms can be used to determine the possibility of a loose wiring condition, and if limits are met, various alarm modes are started.

18 Claims, 5 Drawing Sheets

METHOD AND APPARATUS FOR LOOSE WIRING MONITOR

RELATED APPLICATIONS

This application claims the benefit of U.S. Provisional Patent Application Ser. No. 60/892,462 entitled "METHOD AND APPARATUS FOR LOOSE WIRING MONITOR" and filed on Mar. 1, 2007, the entire contents of which is hereby incorporated by reference.

BACKGROUND

Loose wiring or electrical connections can start electrical fires, causing loss of life and property. An intermittent or loose connection has a higher electrical resistance than a proper connection. When current flows through the connection, excess heat is generated at the connection point, potentially creating a fire hazard. In addition, an intermittent connection can also cause arcing, as inductive loads force current through the connection. One particularly hazardous situation is a "loose neutral". In this case, the neutral connection of a single or three-phase service is not properly connected. With balanced loads, the neutral conductor has no current flow, and thus the improper connection isn't noticed. When loads become unbalanced, the neutral current cannot flow properly through the improper connection, causing some phase voltages to rise, and others to fall, in proportion to the load imbalance. This may cause some phase voltage to rise to dangerous levels, creating significant risk for equipment damage, fire, and shock hazard. If the loose neutral is intermittent, and quickly alternating between low and high resistance, an arc hazard is also present. All these hazardous conditions contribute to a significant risk of fire and loss of life.

The typical way to test for a loose wiring problem is by inspection, or with sophisticated power quality equipment. Testing by inspection requires a trained electrician to torque every service entrance and main panel connection, a costly and risky task. Alternatively, expensive general-purpose power quality monitors (e.g. the PMI "S" series socket recorder) may be used to monitor the phase voltages, and IR temperature instruments may be used to estimate lug temperatures, which can indicate improper connections. These devices are expensive, and require trained personnel to install and analyze the data. In addition, these are generally short term checks—if a loose connection occurs after the spot-check or monitoring period, it will be undetected.

SUMMARY

In one embodiment, the voltage phases, neutral, and ground are monitored and an alarm is generated if specific trigger conditions are met. These conditions are indicative of a possible loose neutral, loose wiring, or general over/under voltage condition. Specific algorithms can be used to determine the possibility of a loose wiring condition, and if limits are met, various alarm modes are started.

In one embodiment, a monitoring system includes a monitoring device configured to detect a loose or intermittent connection of a wire and an alarm system configured to alert a user if the monitoring device detects the loose or intermittent connection. In another embodiment, the wire is a neutral wire. In still another embodiment, the wire is part of a single-phase system, and the monitoring device is further configured to measure both voltage legs and a ground-to-neutral voltage.

In another embodiment, the monitoring device is configured to compute an average RMS phase voltage, compare the average RMS phase voltage to a maximum and a minimum RMS phase voltages, and determine that a loose neutral condition exists if one voltage leg rises in voltage, the other voltage leg falls in voltage, and the sum of the two voltages remains within a threshold value of approximately twice a nominal voltage.

In one embodiment, the wire is part of a three-phase system, and the monitoring device is further configured to measure all three phases and a ground-to-neutral. In another embodiment, the monitoring device monitors a plurality of channels and wherein for each channel a scaled RMS voltage is continuously computed or a proportional or representative signal such as the peak voltage, or average rectified voltage is measured or computed. In still another embodiment, the monitoring device is configured to detect RF emanations. The RF emanations are characteristic of arcing or intermittent connections.

In one embodiment, the monitoring device is configured to measure a temperature using contactless infrared sensing or temperature sensors physically attached to a location. Heating of the location indicates a loose or intermittent connection of the wire. In another embodiment, the monitoring device includes an audio or ultrasonic transducers configured to detect vibrations due to arcing or intermittent connections of the wire. In still another embodiment, the alarm system is configured to alert the user through a network.

In one embodiment, a method includes providing a monitoring device configured to detect a loose or intermittent connection of a wire and alerting a user if the monitoring device detects the loose or intermittent connection. In another embodiment, the wire is a neutral wire. In still another embodiment, the wire is part of a single-phase system, wherein the monitoring device is further configured to measure both voltage legs and a ground-to-neutral voltage.

In one embodiment, the monitoring device is configured to compute an average RMS phase voltage, compare the average RMS phase voltage to a maximum and a minimum RMS phase voltages, and determine that a loose neutral condition exists if one voltage leg rises in voltage, the other voltage leg falls in voltage, and the sum of the two voltages is within a threshold value of approximately twice a nominal voltage. In another embodiment, the wire is part of a three-phase system, wherein the monitoring device is further configured to measure all three phases and a ground-to-neutral. In still another embodiment, the monitoring device monitors a plurality of channels and wherein for each channel a scaled RMS voltage is continuously computed or a proportional or representative signal such as the peak voltage, or average rectified voltage is measured or computed.

In one embodiment, the monitoring device is configured to detect RF emanations. The RF emanations are characteristic of arcing or intermittent connections. In another embodiment, the monitoring device is configured to measure a temperature using contactless infrared sensing or temperature sensors physically attached to a location. Heating of the location indicates a loose or intermittent connection of the wire. In another embodiment, the monitoring device includes an audio or ultrasonic transducers configured to detect vibrations due to arcing or intermittent connections of the wire. In still another embodiment, the method includes alerting the user through a network.

Additional features and advantages are described herein, and will be apparent from, the following Detailed Description and the figures.

DETAILED DESCRIPTION

Measurement System

Figure 5:
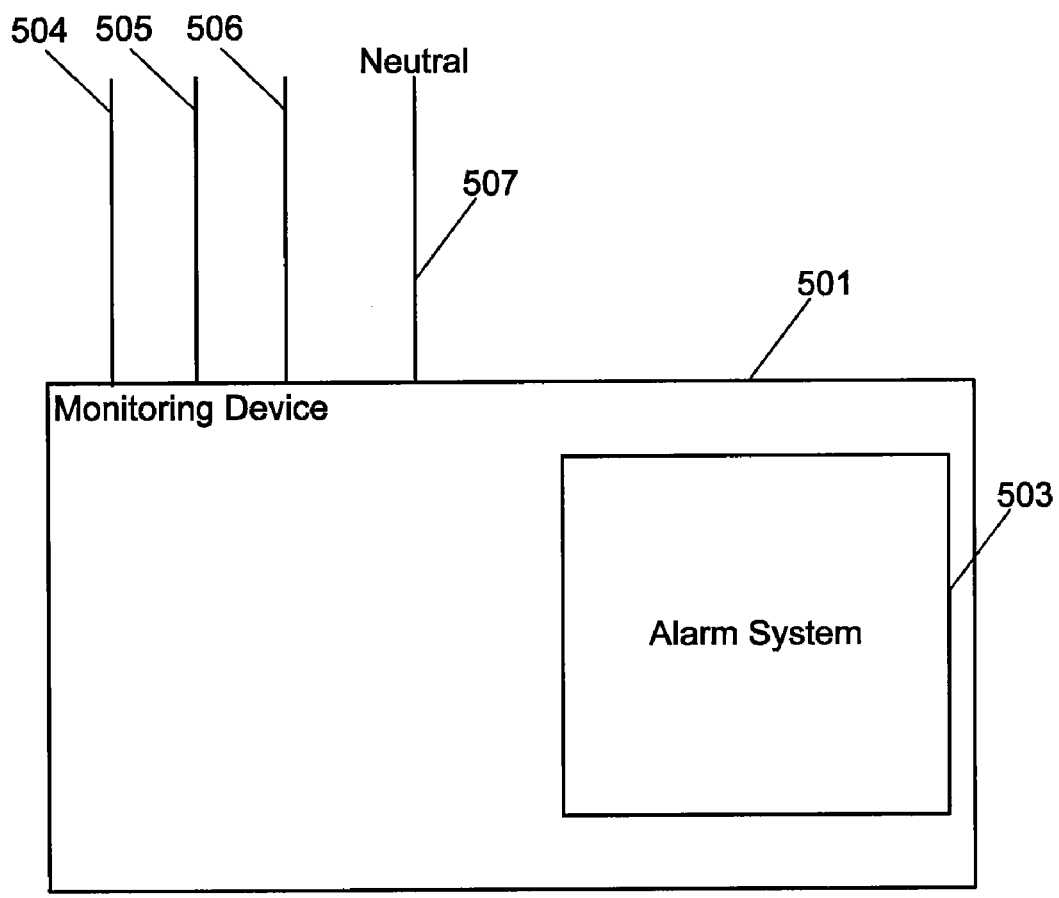
FIG. 5 depicts an exemplary embodiment of a monitoring system.

FIG. 5 depicts an exemplary embodiment of a monitoring system. In one embodiment, a device 501 includes up to four voltage input channels 504, 505, 506 and 507, using the system neutral 507 as a measurement reference; however, any suitable number of channels can be present and any suitable measurement reference can be used. If no neutral is present, then the system ground is used; however, in other embodiments, any other suitable baseline can be used. In a single-phase system, both voltage legs are measured, and also the ground-to-neutral voltage. In a three-phase system, all three phases are measured, and ground-to-neutral. For each channel 504, 505, 506 and 507, a scaled RMS voltage is continuously computed, either with analog circuitry, or by digital sampling and computation. Alternatively, a proportional or representative signal such as the peak voltage, or average rectified voltage may be used instead of the RMS voltage, again generated either with analog circuitry, or computed digitally from sampled waveform data. It should be noted that the above computations can be periodic or sporadic rather than continuous, if so desired.

Once the measurement signal is generated, it is digitized (if not already digital), and further processed by an embedded microcontroller to determine if loose wiring triggers are met. It should be understood that the signal can also be further processed without being digitized, if so desired.

In another embodiment, the raw voltage waveforms are scaled, digitized, and transferred to the microcontroller directly. In addition to the RMS voltage, the raw waveform data itself is also analyzed for loose connection indicators. It should be noted that any suitable values can be analyzed.

Figure 1:
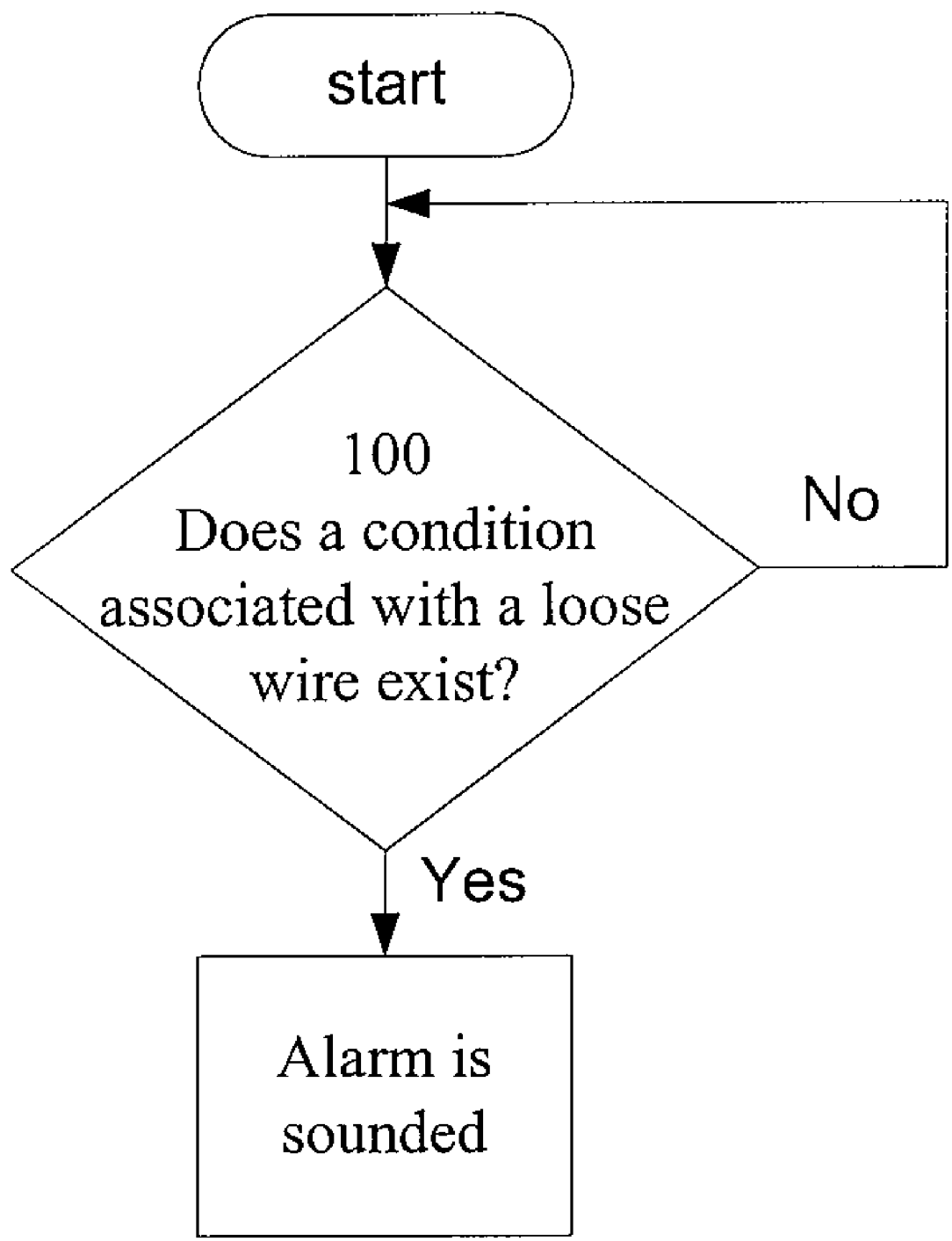
FIG. 1 is a flow diagram of the process of monitoring for a loose wire and sounding an alarm in accordance with one embodiment.

FIG. 1 illustrates the process of monitoring for a loose wire and sounding an alarm in accordance with one embodiment. At block 100, it is determined whether a condition associated with a loose wire exists. If such a condition exists, at step 110, an alarm is sounded. If no such condition exists, the process repeats at step 100.

Algorithms and Metrics

RMS Voltage

In one embodiment, a basic algorithm for loose neutral detection is used. The algorithm includes computing the average RMS phase voltage, and comparing it to the max and min RMS phase voltages. In a single-phase system, a symptom of a loose neutral condition is for one voltage leg to rise in voltage, and the other to fall, with the sum of the two voltages remaining close to twice the nominal voltage. For example, if the voltages start at 119 and 121 volts, then move to 105 and 135 volts, a loose neutral is a likely cause: one leg went up, one went down, and the sum is close to twice the nominal (240 volts). It should be noted that other suitable algorithms are used in other embodiments.

In one embodiment, the RMS loose neutral logic uses three parameters: duration, range, and difference. In other embodiments, any suitable number of any suitable parameters can be used. These parameters can be used to judge whether one voltage leg has risen, and one fallen, while the sum remained the same. The difference is a voltage that specifies the minimum difference between the two legs. For example, if the difference is 16 volts, then there must be at least a 16 volt separation between the two legs. The range is a voltage that specifies how close the sum of the two voltages must be to twice the nominal. For example, a range of 12 volts means that the sum of the two legs must be within 12 volts of twice the nominal voltage. Both the range and the difference conditions must be met for at least the number of seconds specified by the duration. If the duration is set to 5 seconds, then the difference and range conditions must be met for 5 consecutive seconds before a loose neutral is declared. One-second average voltages are used. The nominal voltage is typically 120 volts in a single-phase hookup.

In a three phase system, the algorithm is extended to include all three phases. In this case, the phase with the lowest voltage is subtracted from the phase with the highest voltage to form the difference parameter. The range parameter is compared to the sum of all three RMS phase voltages.

In various other embodiments, other industry standard unbalance algorithms are used, such as those specified in IEC 61000-4-30, section 5.7, using symmetrical components, where appropriate.

Figure 2:
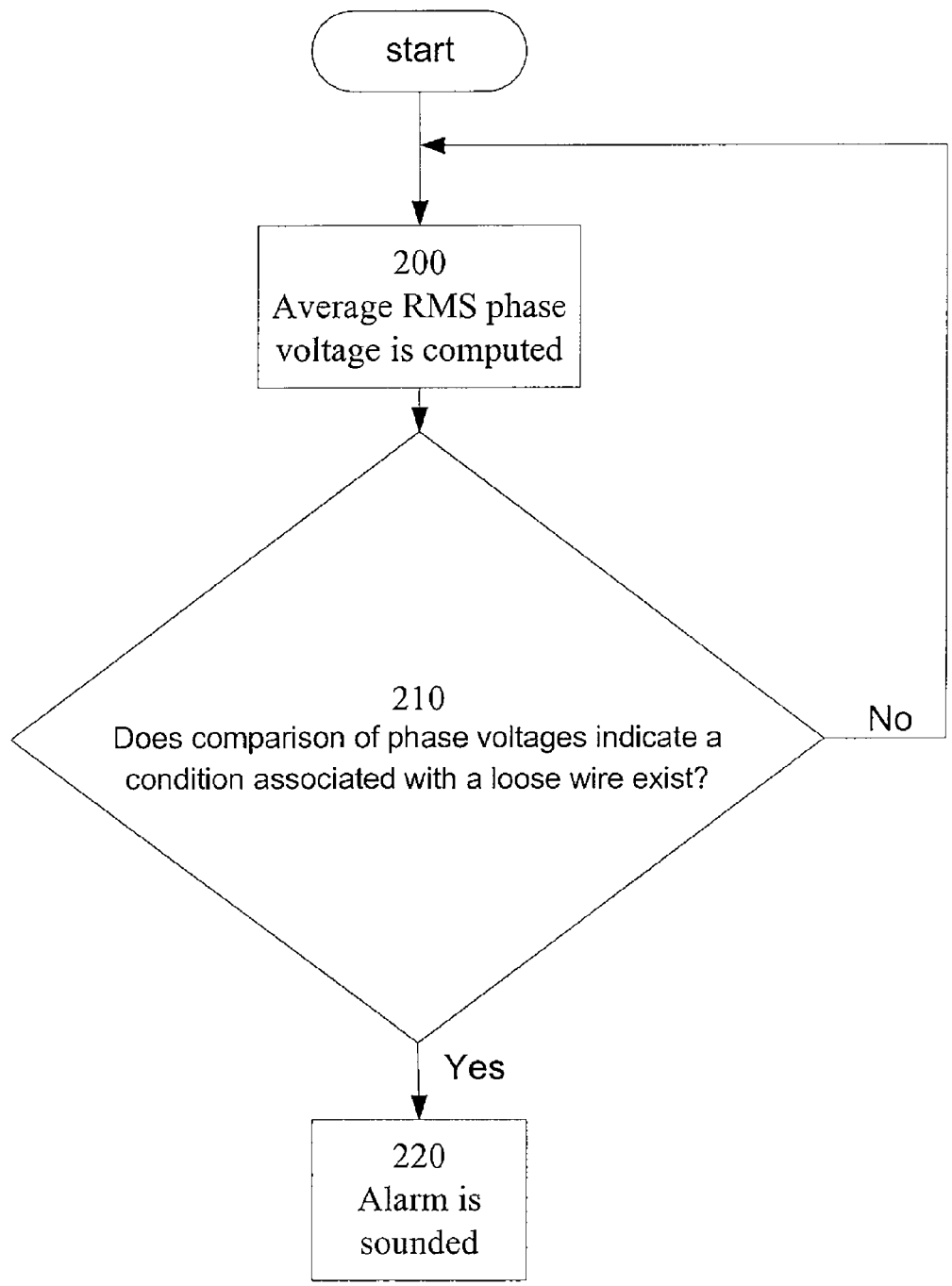
FIG. 2 is a flow diagram of the process of monitoring for a loose wire and sounding an alarm using an RMS phase voltage computation in accordance with one embodiment.

FIG. 2 illustrates the process of monitoring for a loose wire and sounding an alarm using an RMS phase voltage computation in accordance with one embodiment. At block 200, an average RMS phase voltage is computed. At block 210, the average RMS phase voltage is compared to the maximum and minimum RMS phase voltages to determine whether a condition associated with a loose wire exists. If such a condition exists, at step 220, an alarm is sounded. If no such condition exists, the process repeats at step 200.

Waveforms

In one embodiment, sophisticated analysis is possible by utilizing raw waveform data. Voltage transients characteristic of arcing or intermittent connections may be detected by the microcontroller. A process used in one embodiment is to compute waveform shape differences from one AC cycle to the next (e.g. the absolute or mean square difference over a powerline cycle). If the metric from successive waveforms changes frequently (based on setup parameters), then a loose or intermittent connection may be present. Another process used in another embodiment is to high-pass filter the AC signal, either with analog circuitry or digitally (using an FIR or IIR filter, for example). Broadband noise patterns consistent with loose or intermittent connections are detected by the microcontroller.

Figure 3:
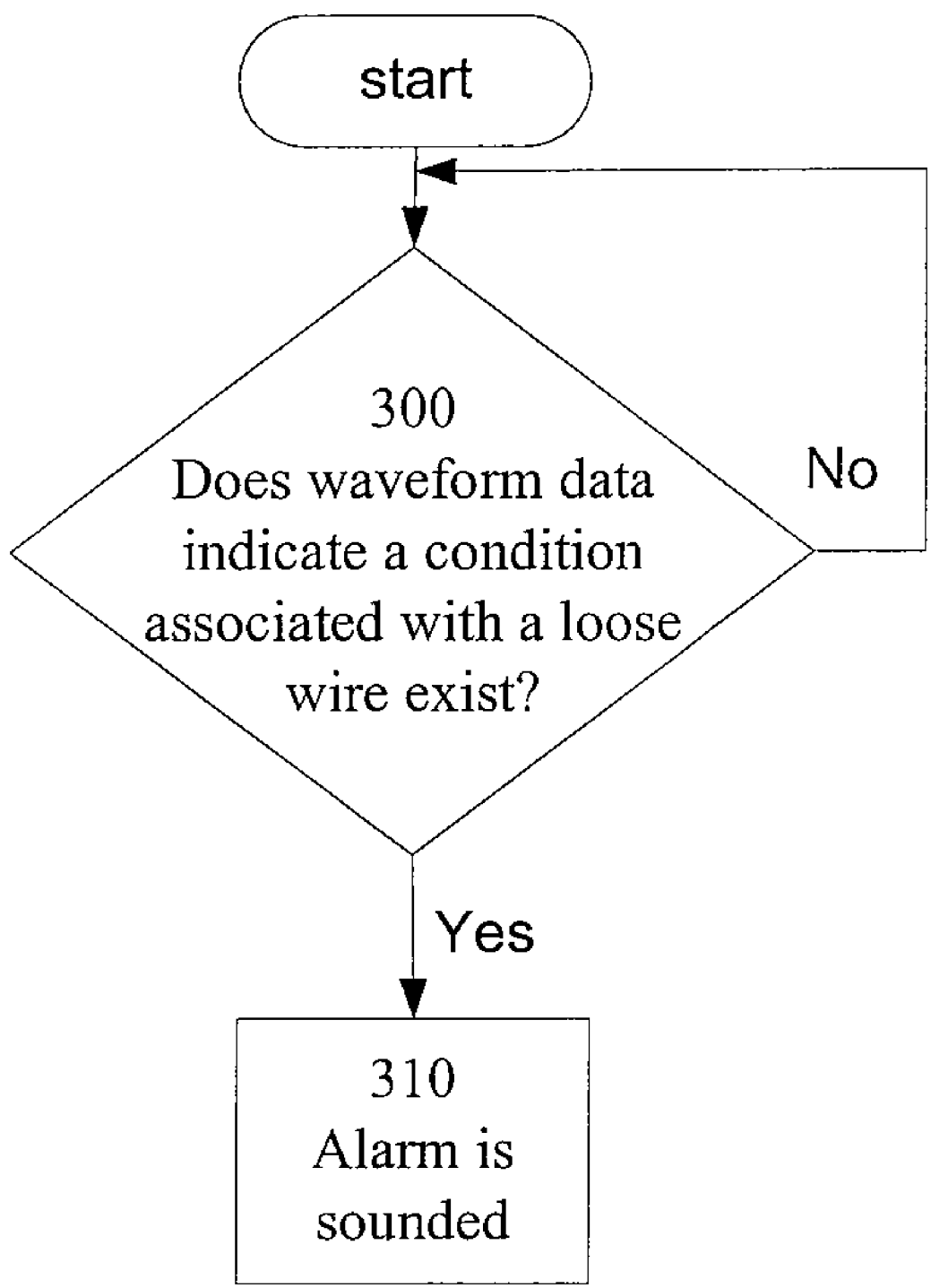
FIG. 3 is a flow diagram of the process of monitoring for a loose wire and sounding an alarm using waveform data in accordance with one embodiment.

FIG. 3 illustrates the process of monitoring for a loose wire and sounding an alarm using waveform data in accordance with one embodiment. At block 300, waveform data is analyzed (e.g., determining the frequency of changes in measurements from AC cycle to AC cycle, or analyzing broadband noise patterns in a high-pass filtered signal) to determine whether a condition associated with a loose wire exists. If such a condition exists, at step 310, an alarm is sounded. If no such condition exists, the process repeats at step 300.

Voltage Drop

In one embodiment involving a multiple-device 501 installation, one device 501 can be installed at the service entrance, or at the secondary of the distribution transformer (or any other suitable location), and a second device 501 at the main panel, or at a branch circuit (ideally circuit with all voltage phases) or any other suitable location. In this setup, the devices 501 could compare the voltage readings at the two points, and compute the voltage drop between them. This voltage drop would include the drop across all splices and lug terminations due to their resistance. In a loose or intermittent connection, this drop would vary as the connection quality degrades (since the connection resistance will vary), and would be detected by the devices 501. The devices 501 may communicate with each other (via power line communications, wirelessly, etc.) to compute the voltage drop, communicate in real-time to a third device 501 for this computation, or this metric may be computed offline by a third device 501 after recorded data has been extracted from the two devices 501 or computation and/or communication can occur in any other suitable manner.

In an alternative embodiment, if the service entrance device 501 is also measuring the AC line current for each phase, the current measurements may be used to improve the connection resistance estimate, by separating the effect of changing load current from changing connection resistance on the voltage drop.

In various embodiments, the above Voltage Drop techniques or any other suitable techniques may be used on RMS data or raw waveform data or any other suitable data.

Figure 4:
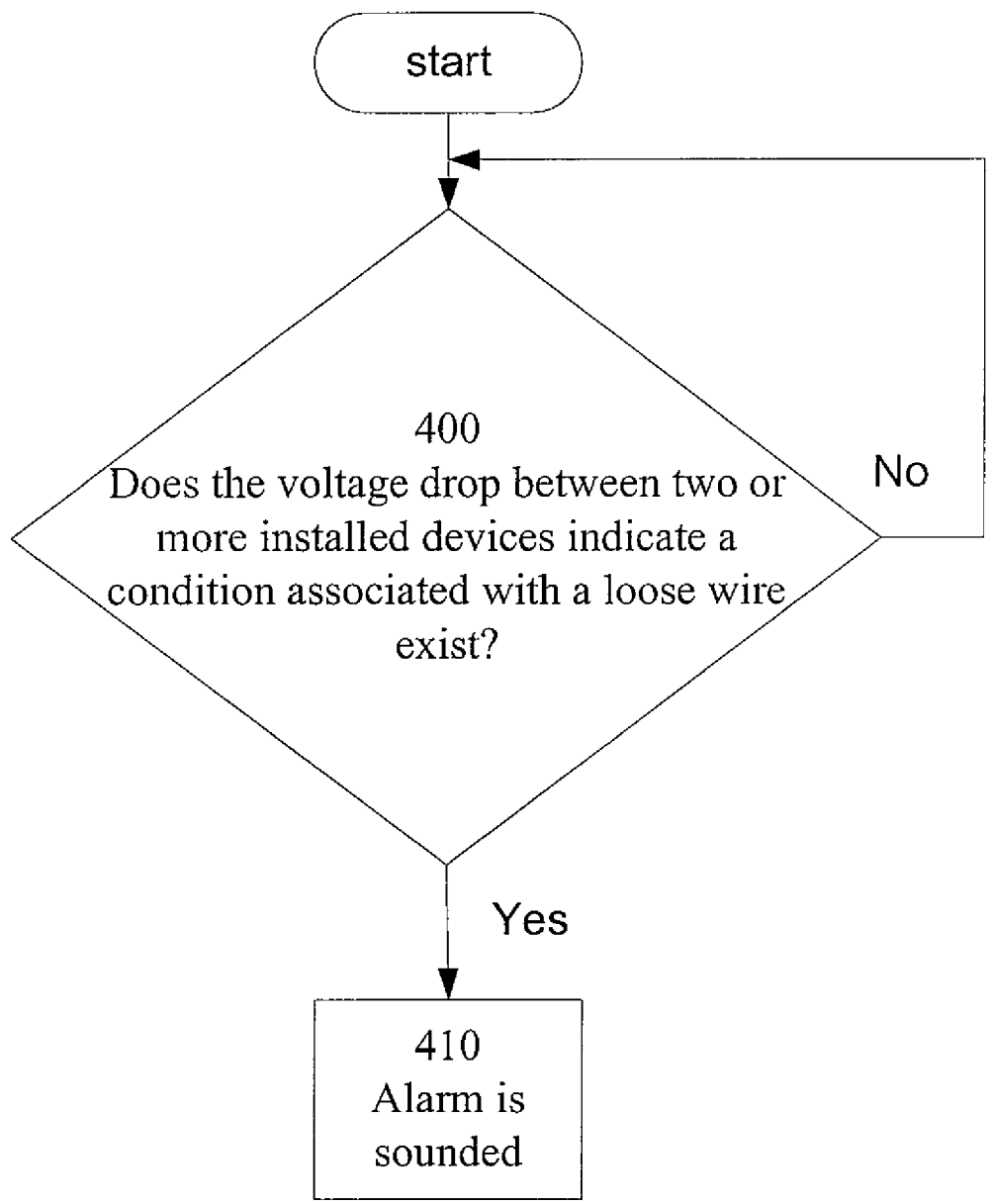
FIG. 4 is a flow diagram of the process of monitoring for a loose wire and sounding an alarm using multiple devices measuring voltage drops in accordance with one embodiment.

FIG. 4 illustrates the process of monitoring for a loose wire and sounding an alarm using multiple devices 501 measuring voltage drops in accordance with one embodiment. At block 400, the voltage drop between two or more installed devices 501 is analyzed to determine whether a condition associated with a loose wire (e.g., the drop varying) exists. If such a condition exists, at step 410, an alarm is sounded. If no such condition exists, the process repeats at step 400.

Over/Under Voltage

In one embodiment, in addition to metrics designed to detect loose or intermittent connections, the system can detect gross overvoltage or undervoltage conditions or any other suitable conditions. These conditions can cause the same or similar types of equipment damage and hazardous situations as loose connections. Generally the RMS voltage will be used for this measurement, over an averaging period on the order of seconds or longer; however, any suitable voltage or other value can be used.

Ground Voltage

In one embodiment, neutral-ground voltage may indicate a loose or missing connection inside the building wiring, or may also be an indication of other wiring problems not associated with loose or intermittent connections. The effects of elevated ground voltage can be as hazardous, though, and the device 501 can monitor this voltage and compute alarm metrics in addition to the other functions, in a fashion similar to the Over/under Voltage methodology discussed above or in any other suitable fashion.

Others

In other embodiments, other measurements can also be used to estimate loose connection presence. If the device 501 is at the service entrance or any other suitable location, for example in the meter base, RF emanations that are characteristic of arcing or intermittent connections may be measured. In another embodiment, temperature measurement of lugs and splice points can be used, using contactless infrared sensing, or temperature sensors physically attached to the lugs or any other suitable measuring device. In another embodiment, audio and ultrasonic transducers or other suitable devices are used to detect vibrations due to arcing or intermittent connections.

In various embodiments, any of the above sensors may be wired into the main device 501, or send their readings wirelessly or via power line communications to the main device 501 or communicate in any other suitable manner.

Combination of Readings

In various embodiments, any or all of the individual metrics listed above (or any other suitable metrics) can be individually used to generate an alarm condition, or may be used together in any suitable manner. Methods to combine multiple metrics include a weighted average, or a nonlinear system such as a decision tree, fuzzy logic, or customized hybrid scheme or any other suitable combination scheme. In various embodiments, various alarm levels are also possible, indicating varying levels of probability of a loose connection, or varying estimated levels of risk or any other suitable conditions.

In various embodiments, individual device metrics can be combined in a similar plurality of methods to form aggregate metrics. This may be performed by one or more measuring devices 501, or by a third coordinating device 501, which may be located remotely or in any other suitable manner by any suitable device 501. For example, alternatively, this computation may be done offline from recorded data extracted from the measuring devices 501.

In various embodiments, a device 501 includes a partial implementation of the above measurement techniques and metrics, a subset of them, or other metrics not listed, but which are well-known in the industry or any suitable combination thereof.

Device Setup

In one embodiment, all the above measurement techniques are fully adjustable via setup parameters; however, such adjustability is not required and can be accomplished in any suitable manner.

In one embodiment, the parameters are set at the factory, and no user setup is required—the devices 501 are simply installed, and start functioning immediately. In an alternate embodiment, the devices 501 are set up by a intermediate party, and given to the end user, and no end-user setup is required. For example, an electric utility may receive the devices 501 from the manufacturer, and load their preferred settings into the devices 501. The devices 501 are then given to end-users, and no end-user setup is performed—the utility's setup is always used. In still another embodiment, it is possible to enable the end-user to perform device 501 setup. Further, in various embodiments, a combination of setup types is possible, by enabling the setup type to be specific to each parameter. For example, some parameters may be fixed at the factory, some adjusted by an electric utility, and some adjustable by the end user. In particular, it may be desirable to allow the alarm levels and alarm actions to be user adjustable.

In one embodiment, recording and communication parameters may also be adjusted separately from the parameters used to compute metrics.

Recording

Various embodiments will not have recording capability. Once the device 501 has determined an alarm condition exists, it performs the alarm action, and stays latched in this mode.

Other embodiments can include a recording capability, where the various loose connection metrics can be logged. This logging may include max/min/average trend recording, as well as histogram recording, and event-based logs or any other suitable records. The event logs can include alarm declaration logging, as well as logging of metric values that don't qualify as alarm conditions or any other suitable data. In addition, the source signals, such as RMS voltage, raw waveform voltage, other sensor inputs, etc. may be logged as desired. Other information, such as power quality and power outage information or any other suitable data may also be logged.

In one embodiment, the device 501 only logs alarm triggers.

Alarm System

In one embodiment, when an alarm condition is generated (based on some combination of metrics and thresholds as described above or in any other suitable manner), one or more alarm actions are taken by an alarm system 503. The specific action or actions can depend on the severity of the alarm condition and the device 501 configuration or any other suitable condition. In one embodiment, the device 501 uses a visible indicator (e.g., a flashing LED or any other suitable device) to alert the user. A numeric display may also give an indication of the severity, or display a measured value or any other suitable information. In another embodiment, an audible alarm, such as a buzzer or annunciator may be used. This may vary in intensity and pattern depending on the alarm severity, up to the level of a smoke detector output, intended to clear out the entire building. It should be understood that any suitable alarm may be used and any suitable action can result.

In one embodiment involving multi-device 501 installations, the alerting device can communicate the alarm condition to others via wireless, power line, or any other suitable communications methods. In one embodiment, this can be used to propagate the alarm state to other areas. In some situations, the measuring device 501 may be outside the building or in a remote location (e.g. behind a dryer in a laundry room), and have no audible or visible alarm capability, while a second device 501 is inside the building. In one embodiment, the second device 501 is not directly involved in measurement—it essentially receives alarm conditions from the measuring devices 501, and broadcasts the alarm with audible or visible indicators.

In one embodiment, one or more devices 501 in the system may have a connection to a separate network, e.g. via phone modem, pager, Ethernet or WiFi connection to the internet, power line modem, etc. This network may be used to connect with the local electric utility or other monitoring service, and may also be set to relay the alarm via email, etc. The devices 501 may also connect into existing building security or safety networks, e.g. fire or burglar alarm systems. In some cases, the local alarm may be silent, while remote alarm is activated, in a fashion similar to building security systems with silent alarms.

In various embodiments, alarm states may be latching, or non-latching. A latching alarm persists until reset by the end user or the group who configured the device 501, even if the measured condition that generated the alarm is no longer present. A non-latching alarm ceases when the measured condition is no longer present, or after a fixed period of time after detection. In various embodiments, latching or non-latching alarms may be configurable, and also depend on the metric severity.

Communications

In one embodiment, as described above and/or below in connection with various embodiments, each device 501 in the system may employ one or more communication methods for various purposes. In one embodiment, power line communications or wireless methods may be used to link devices 501 together to propagate alarm states, and also to combine measurements for multi-devices 501 algorithms and metrics. In other embodiments, a central device 501 may be used to receive raw measurements, and perform all computations and alarm computations. Mesh, star, and other network topologies are possible. In a mesh network, devices 501 would also pass message to other devices. A device 501 may also be used as a bridge to one or more other networks, such as the internet, or existing security or alarm system. This may be performed via phone modem, pager, wireless or wired network (Ethernet, for example), or separate power line modem system. A device 501 may incorporate one or more communications subsystems, and automatically use any suitable communications mechanism depending on the installation environment. In one embodiment, if the device 501 is placed in an electrical network that uses programmable logic controller (PLC) communications such as X10, INSTEON, HomePlug, etc., the device 501 may automatically detect and join one or more of the PLC networks, particularly if one is being used for other alarm or monitoring functions. It should be understood that various embodiments can have any suitable communications devices using any suitable communications protocols and/or carriers.

Additional Embodiments

Many different embodiments are possible. Measurements may be made in various embodiments at any point where all voltage phases are accessible. In residential locations, suitable connection points include at the service entrance at the meter base, in or near the main breaker panel, and at 240V receptacles (e.g. a clothes dryer plug); however, any other suitable connection point can be used. At the service entrance, the device 501 could be contained in a revenue meter along with the meter electronics, in a meter-base extender enclosure, or inside the meter base itself. At the main panel, the device 501 could be incorporated into the main panel breaker, in a separate multi-pole breaker (or non-functional breaker-like device 501 in the panel), or hard-wired just outside the main panel. At a 240V receptacle, the device 501 could take the form of a pass-through plug. In this case, the device 501 would plug into the receptacle, and also allow a 240V load to plug into it to receive power (e.g., a clothes dryer plug).

In one embodiment involving a three-phase application, a 3-phase receptacle could be utilized with a pass-through device 501, or a 3-pole breaker in an electrical panel. Alternatively, devices 501 may be hard-wired into the electrical system. Since electrical service wiring generally connects all loads in parallel, the voltage monitors may often be located anywhere in the secondary system, since all monitoring points would sense the same voltage fluctuations (for some measurement techniques, at least—sensors such as IR, RF, etc. would need to be close to the intermittent connection point).

In another embodiment, another possible location is at the secondary of a distribution transformer, either on a power pole, or underground in a manhole, handhole, or vault.

In various embodiments, single-phase devices 501 could also be used in the main panel (using a single-pole version of the breaker embodiments), or at 120V receptacles. In this case, one system uses multiple devices 501 to include all voltage phases in the calculations and metrics. The devices 501 would communicate with each other, and/or to a central device 501, via one or more communications methods described above.

In various embodiments, some devices 501 may have measurement capability only, or alarm capability only, or some combination of abilities. Preferably, other devices 501 would have complementary capabilities; however, other devices 501 are not required and can have any suitable abilities. For example, one device 501 in a system may only provide measurements and metric computation, while a second device

501 provides alarm outputs. They are linked via communication methods described above.

In one embodiment, a device 501 configuration may also be embedded in other devices 501. For example, a power quality meter, power line communication node, smoke or CO2 monitor, appliance, etc. may also incorporate the functionality described above, while also performing its normal function.

Although this system is described as monitoring for loose or intermittent connections associated with the service entrance or main panel, it is understood that the method and apparatus may also be used for similar monitoring at any point where loose or intermittent electrical connections may be present.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A monitoring system comprising:
a monitoring device configured to detect a loose or intermittent connection of a wire; and
an alarm system configured to alert a user if the monitoring device detects the loose or intermittent connection,
wherein the monitoring device is configured to measure phase voltages in a single-phase system comprising two voltage legs, and determine that a loose neutral condition exists if one voltage leg rises in voltage, the other voltage leg falls in voltage, and the sum of the two voltages is within a threshold value of approximately twice a nominal voltage.

2. The monitoring system of claim 1, wherein the wire is a neutral wire.

3. The monitoring system of claim 1, wherein the wire is part of a single-phase system comprising two voltage legs, wherein the monitoring device is further configured to measure both voltage legs and a ground-to-neutral voltage.

4. The monitoring system of claim 1, wherein the wire is part of a three-phase system, wherein the monitoring device is further configured to measure all three phase voltages and a ground-to-neutral voltage.

5. The monitoring system of claim 1, wherein the monitoring device monitors a plurality of channels and wherein for each channel a scaled Root Mean Square (RMS) voltage is continuously computed or a proportional or representative signal comprising one of a peak voltage and an average rectified voltage is measured or computed.

6. The monitoring system of claim 1, wherein the monitoring device is configured to detect RF emanations, the RF emanations being characteristic of arcing or intermittent connections.

7. The monitoring system of claim 1, wherein the monitoring device is configured to measure a temperature using contactless infrared sensing or temperature sensors physically attached to a location, wherein heating of the location indicates a loose or intermittent connection of the wire.

8. The monitoring system of claim 1, wherein the monitoring device includes an audio or ultrasonic transducers configured to detect vibrations due to arcing or intermittent connections of the wire.

9. The monitoring system of claim 1, wherein the alarm system is configured to alert the user through a network.

10. A method comprising:
providing a monitoring device configured to detect a loose or intermittent connection of a wire; and
alerting a user if the monitoring device detects the loose or intermittent connection,
wherein the monitoring device is configured to measure phase voltages in a single-phase system comprising two voltage legs, and determine that a loose neutral condition exists if one voltage leg rises in voltage, the other voltage leg falls in voltage, and the sum of the two voltages is within a threshold value of approximately twice a nominal voltage.

11. The method of claim 10, wherein the wire is a neutral wire.

12. The method of claim 10, wherein the wire is part of a single-phase system comprising two voltage legs, wherein the monitoring device is further configured to measure both voltage legs and a ground-to-neutral voltage.

13. The method of claim 10, wherein the wire is part of a three-phase system, wherein the monitoring device is further configured to measure all three phase voltages and a ground-to-neutral voltage.

14. The method of claim 10, wherein the monitoring device monitors a plurality of channels and wherein for each channel a scaled Root Mean Square (RMS) voltage is continuously computed or a proportional or representative signal comprising one of a peak voltage and an average rectified voltage is measured or computed.

15. The method of claim 10, wherein the monitoring device is configured to detect RF emanations, the RF emanations being characteristic of arcing or intermittent connections.

16. The method of claim 10, wherein the monitoring device is configured to measure a temperature using contactless infrared sensing or temperature sensors physically attached to a location, wherein heating of the location indicates a loose or intermittent connection of the wire.

17. The method of claim 10, wherein the monitoring device includes an audio or ultrasonic transducers configured to detect vibrations due to arcing or intermittent connections of the wire.

18. The method of claim 10, further comprising alerting the user through a network.

* * * * *